United States Patent

Hayashi et al.

[11] 4,297,652
[45] Oct. 27, 1981

[54] INJECTION-TYPE SEMICONDUCTOR LASER

[75] Inventors: Izuo Hayashi; Hiroo Yonezu, both of Tokyo, Japan

[73] Assignee: Nippon Electric Co., Ltd., Tokyo, Japan

[21] Appl. No.: 83,043

[22] Filed: Oct. 9, 1979

[30] Foreign Application Priority Data

Oct. 11, 1978 [JP] Japan .......................... 53-125585

[51] Int. Cl.³ ............................................. H01S 3/19
[52] U.S. Cl. ............................................. 331/94.5 H
[58] Field of Search ................................. 331/94.5 H

[56] References Cited

U.S. PATENT DOCUMENTS 3,978,426 8/1976 Logan et al. .................. 331/94.5 H Primary Examiner—James W. Davie
Attorney, Agent, or Firm—Sughrue, Mion, Zinn, Macpeak and Seas

[57] ABSTRACT

A semiconductor laser having a double heterostructure configuration is provided with a light waveguide layer extending between a pair of mirrors. A thin active layer is disposed adjacent to the waveguide layer, and is formed in the shape of a stripe having a width of approximately 5 μm. The stripe is shorter in axial length than the waveguide, such that the ends of the stripe are spaced from the mirrors by a distance of 30 to 60 μm.

10 Claims, 6 Drawing Figures

INJECTION-TYPE SEMICONDUCTOR LASER

BACKGROUND OF THE INVENTION

A present invention relates to a high-power injection-type semiconductor laser, and more particularly to a fundamental-transverse-mode stripe buried heterostructure laser with an extremely high optical power density emission.

The maximum available optical power of semiconductor lasers has been limited by the catastrophic optical mirror damage (COMD), which is a local destruction of laser mirrors at high optical power density emission. The critical optical power density of the COMD is typically of the order of $10^6$ W/cm$^2$ in continuous wave (CW) operation. If a transverse-mode is limited to a small width of a few microns, in a fundamental mode or lower order modes, the critical optical power of the COMD is several orders of magnitude less than the above value in the CW operation. Even below the critical optical power, the higher the optical power is, the more intense the mirror oxidation becomes, thereby causing gradual degradation under CW operation. Therefore, the COMD has to be controlled to increase the optical power density.

It has been known that the COMD is caused by absorption of a laser light in an active layer near a pair of reflective surfaces, or mirrors. The absorption of the laser light generates heat and reduces the band gap due to a temperature rise, and results in a further increase in the light absorption coefficient in the vicinity of the mirrors. There are two theories of the probable cause of the COMD The first theory is that a thermal strain or fusion is generated through the above heat cycle when an intense laser light is emitted. The other theory is that destruction, due to lattice oscillation of stimulated Brillouin scattering, is caused by an increase in the absorption coefficient. When the active layer is uniformly injected and excited, the injected carrier density decreases in the vicinity of the mirrors. This is because the surface recombination velocity near the mirrors is larger than that at an inner portion. Therefore, the effective band gap near the mirrors becomes smaller than that of the inner portion, and the section near the mirrors becomes an absorber of the photon energy of the laser light, which is regulated by a high injection carrier density inside. Accordingly, in an ordinary injection-type semiconductor laser, where the active layer reaches the mirrors, the COMD cannot be avoided irrespective of its configuration, or crystal material.

Recently, the inventors of the present invention have attempted to avoid the COMD by making the band gap of the active layer near the mirrors effectively larger than that of the inner portion, by controlling the impurity density, and by making absorption of laser light near the mirrors smaller. However, because the difference in the band gaps could not be made larger, there was a limitation to the impurity density that could be used to avoid the COMD.

On the other hand, various types of laser configurations have been developed to separate an active layer for injection and excitation from a waveguide layer for laser light emission. An article in Applied Physics Letters, Vol. 32, No. 5, pages 311 to 314, shows that an excellent result is obtained in a transverse-mode controlled by adopting a rib structure in a construction in which the thin active layer has a stripe geometry and is adjacent to the wide waveguide layer. However, even with such configuration, it is hard to avoid the COMD. For example, when the stripe width is 5 $\mu$m, the COMD arises at the optical power of about 200 mW (nearly equal to $4 \times 10^6$ W/cm$^2$) in a pulsed operation.

SUMMARY OF THE INVENTION

The purpose of the present invention is to provide an extremely high power injection-type semiconductor laser in a configuration of controlled transverse-mode, permitting long-term stable operation without generating the COMD.

A semiconductor laser according to the present invention has a double heterostructure configuration in which a light waveguide layer is provided adjacent to a thin layer and an active layer does not reach the reflection surfaces (mirrors).

BRIEF DESCRIPTION OF THE DRAWINGS

Referring to FIG. 1A and FIG. 1B, a layer 11 of n-Al$_{0.35}$Ga$_{0.65}$As (thickness 3 $\mu$m) is formed on an n-GaAs substrate 10, and thereon a waveguide layer 12 of n-Al$_{0.15}$Ga$_{0.85}$As (thickness 0.5 $\mu$m), an active layer 13 of p-Ga As (thickness 0.1 $\mu$m), and a layer 14 of p-Al$_{0.35}$Ga$_{0.65}$ As (thickness 2 $\mu$m) are successively formed, all by a conventional liquid-phase epitaxial growth method. The stripe geometry of active layer 13 is formed by etching down both the p-Al$_{0.35}$As$_{0.65}$ layer 14 and the ative layer 13 to the upper surface of the waveguide layer 12, leaving only an inner stripe region of 5 $\mu$m in width and 250 $\mu$m in length. Thereafter, the p-Al$_{0.35}$Ga$_{0.65}$ As layer 14 is grown again. Electrodes 15 and 15' are then formed on the surfaces of the layer 14 and the substrate 10. The side faces 18 of the chip crystal are cleaved to form reflecting surfaces.

Figure 1:
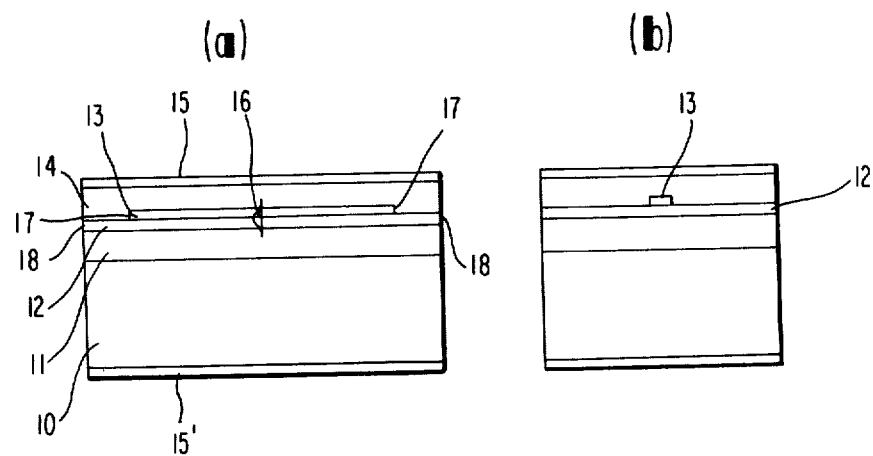
FIG. 1A is a longitudinal cross section taken along the direction of the resonator of a semiconductor laser according to the first embodiment of the present invention.
FIG. 1B is a transverse cross section taken along the direction perpendicular to the direction of the resonator of FIG. 1A.

In this structure, electrons are injected and a gain is generated in the thin active layer 13 when a forward current is supplied through the electrodes 15 and 15'. It is hard to flow the forward current through the p-n junction formed between the waveguide layer 12 and the p-Al$_{0.35}$Ga$_{0.65}$ As layer 14 due to a large band gap. Regarding a laser light distribution 16 perpendicular to the active layer, most of the light energy exists in the waveguide layer 12 because the waveguide layer 12 is thicker than the active layer 13. Therefore, although there is a slight reflection at both ends 17 of the active layer 13, a resonator is formed between a pair of cleaved mirrors 18 (resonator length is about 300 μm) through the waveguide layer 12. Since the gain is generated in the active layer 13, the photon energy of the laser light depends on the band gap of the active layer 13. In the case of FIGS. 1A and 1B, the lasing wavelength is about 8,700 Å (the photon energy is nearly equal to 1.4 eV), and the band gap of the waveguide layer 12 is about 1.6 eV so that laser light is not absorbed at all in the waveguide layer 12. Needless to say, absorption does not exist near the reflection surfaces (mirrors) 18 either, thus the COMD does not occur. Regarding the direction parallel to the active layer 13, the present embodiment has a stripe waveguide mechanism having the width of 5 μm. In this waveguide mechanism, a fundamental transverse-mode can be realized by defining the stripe width 5 μm or less. The COMD has occurred in a conventional laser having this stripe width at about 50 mW under the CW operation. In this embodiment, however, the COMD does not occur even if the optical power is increased to a value ten times higher than that of the conventional laser.

Figure 2:
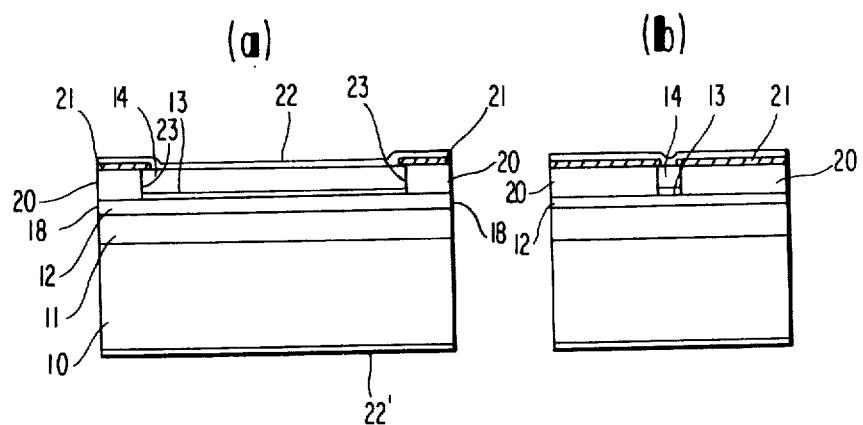
FIG. 2A is a longitudinal cross section taken along the direction of a resonator of a semiconductor laser according to the second embodiment of the present invention.
FIG. 2B is a transverse cross section taken along the direction perpendicular to the direction of the resonator of FIG. 2A.

Referring now to FIG. 2A and FIG. 2B, an embodiment is illustrated which is designed to suppress an extra current that flows very slightly in the p-n junction formed between the waveguide layer 12 and the outside region of the stripe active region 13. In this embodiment, the manufacturing process is similar to the first embodiment to the extent of the etch back process of the p-$Al_{0.35}Ga_{0.65}$As layer 14, and the active layer 13 to form a stripe region. In the next step, however, an n-$Al_{0.35}Ga_{0.65}$As layer 20 is grown instead of the p-$Al_{0.35}Ga_{0.65}$As layer. After that, an insulative film 21 such as $SiO_2$ is formed on the layers 14 and 20 and an opening corresponding to the stripe regions is provided on the film 21. Then, a positive electrode 22 is formed on the film 21 and its opening region to contact with the p-$Al_{0.35}Ga_{0.65}$As layer 14. If needed, zinc (Zn) may be diffused on the surface to lower ohmic resistance.

In the second embodiment, nearly no forward current flows through the p-n junction 23 formed between the $Al_{0.35}Ga_{0.65}$As layers 14 and 20 due to large band gap, therefore a concentrated current flows only through the stripe active layer region 13 when a forward current is supplied between the positive electrodes 22 and the negative electrodes 22' formed on the substrate 10. For this reason, lower threshold current and higher efficiency are achieved.

Figure 3:
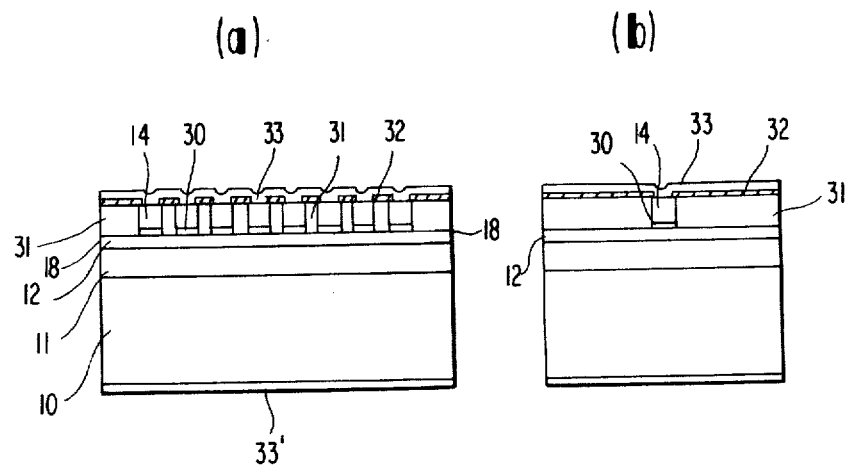
FIG. 3A is a longitudinal cross section taken along the direction of the resonator of the semiconductor laser according to the third embodiment of the present invention.
FIG. 3B is a transverse cross section taken along the direction perpendicular to the direction of the resonator of FIG. 3A.

In the third embodiment of the present invention as shown in FIGS. 3A and 3B, an active layer 30 is divided into many regions which are 20 μm in length and arranged at 10 μm spacings. An n-$Al_{0.35}Ga_{0.65}$As layer 31 is grown in the same manner as that for the second embodiment, and the array of openings are provided on an insulative film 32 corresponding to the active layer regions. An ohmic electrode layer 33 is formed over the film 32 and the exposed regions of the layer 14.

When a forward current is applied through electrodes 33 and 33', the divided active layer regions 30 are excited. A slight light reflection occurs in the direction of the 20-μm lengths in each of the active layer regions 30 because of the existence of the n-$Al_{0.35}Ga_{0.65}$As layer 31. For this reason, a longitudinal-mode with spacings of about 45 Å corresponding to a 20-μm resonator length is generated. Only those wavelengths which coincide with these characteristics and the longitudinal-mode corresponding to the resonator spacings of the mirrors 18 are selected. In this manner, the longitudinal-mode is fixed into a single mode even during transient response. Since the resonator spacings become wider as the length of the active layer 30 shortens, it is convenient to unify the longitudinal modes.

In the forgoing embodiments, laser light tends to exist more within the active layer 13 or 30 when the thickness of the active layer 13 or 30 is made thicker, or the band gap difference with the waveguide layer is made larger. Therefore, the threshold current decreases. In the third embodiment, it will be more advantageous if the thickness of the active layer is large, or if the band gap difference becomes larger, for the laser light reflection increases in each resonator of the active layer regions 30. As for the unification of the longitudinal-mode, reflective regions of a distributed feedback type with a diffraction lattice may be provided on the waveguide layer near the mirrors where the active layer 13 or 30 does not exist as shown in the above three embodiments. However, when such reflective regions are formed, crystalline defects are often introduced. In the configuration of the present invention, however, no carriers are injected in the vicinity of the mirrors, thus the present invention is free from the above defects contributing to mirror degradation. A preferable range for the distances between mirrors 18 and the ends 17 of the active layer 13 or 30 is 30-60 μm, and more preferably, the value is approximately 50 μm.

In the above three embodiments, the active layer is located on the upper side of the waveguide layer 12 in the drawings. However, the active layer may alternately be formed underneath the waveguide layer. In this instance, the active layer should be embedded in the n-$Al_{0.35}Ga_{0.65}$As layer 11 to make the stripe-like active layer act as an controlling means for the transverse-mode. The effect of the present invention is not affected by whether the active layer has a stripe geometry or not. The present invention, for example, can be applied to a high-power laser having an active layer width of 100 μm or more but not the stripe geometry. The third embodiment can be constructed using the same concept of the first embodiment. The thicknesses and compositions of the active layer and waveguide layer are not limited to the foregoing examples, as long as the relations of the gain concentrating in the active layer, and the light waves being coupled in the waveguide layer are maintained. The GaAs active layer can be replaced by an $Al_yGa_{1-y}As$, and the aluminium (Al) composition in the waveguide layer is not necessarily limited to the foregoing composition. The p-n conduction type can be a reversal of the foregoing.

As will be understood from the foregoing description, the COMD can definitely be avoided by the present invention. Unlike the semiconductor lasers whose impurity density is controlled by conventional methods, the composition of the crystal materials of this invention is controlled so that a sufficiently large band-gap difference can be obtained. Further, unlike the semiconductor laser shown in the aforesaid Applied Physics Letters, the sections near the mirrors are transparent relative to laser light so that the mirror oxidation is slight, even if no protection film is provided over a long period of time to permit stable operation. Furthermore, this invention excells in terms of the control of the longitudinal-mode. That is, by separating the active layer in the direction of a resonator, the function of the double resonator or distribution feedback resonator is obtained so that the single longitudinal mode operation can be realized even in high speed modulation. The present invention can be applied to various crystal materials such as (Al.Ga) As, (InGa) and (AsP).

What is claimed is:

1. In a semiconductor laser having a multi-layer structure formed on a substrate and two opposing cleaved surfaces, said semiconductor laser comprising:
   a first semiconductor layer for guiding a laser beam;
   an active layer disposed in contact with said first semiconductor layer, said active layer being formed in the shape of a stripe, said stripe having substantially planar ends which are spaced from said cleaved surfaces;
   a third semiconductor layer burying said active stripe;
   a first electrode for supplying a first electric potential through said third semiconductor layer; and
   a second electrode formed on said substrate for supplying a second electric potential thereto.

2. A semiconductor laser as claimed in claim 1, wherein the width of said active layer stripe is approximately 5 $\mu$m.

3. A semiconductor laser as claimed in claim 1, wherein the ends of said active layer stripe are spaced from said mirrors by a distance of 30 to 60 $\mu$m.

4. A semiconductor laser as claimed in claim 1, wherein said third semiconductor layer has a conductivity type opposite that of said first semiconductor layer.

5. A semiconductor laser as claimed in claim 1, said third semiconductor layer having a first portion of a conductivity type opposite the conductivity type of said first semiconductor layer and being formed over said active layer, and having a second portion having the same conductivity type as said first semiconductor layer.

6. A semiconductor laser as claimed in claim 5, wherein an insulative film is formed over said second portion.

7. A semiconductor laser as claimed in claim 5, wherein said active layer is formed as a segmented stripe.

8. A semiconductor laser as claimed in claim 5, wherein the ends of said segmented stripe are spaced from said mirrors by a distance of 30 to 60 $\mu$m.

9. In a semiconductor laser having a multi-layer structure formed on a substrate and two opposing cleaved surfaces, said semiconductor laser comprising:
   a first semiconductor layer for guiding a laser beam;
   an active layer disposed in contact with said first semiconductor layer, said active layer being formed in the shape of a segmented stripe, said segmented stripe at both ends having substantially planar ends which are spaced from said cleaved surfaces;
   a third semiconductor layer of a first conductivity type formed between adjacent portions of said segmented stripe and between each of said cleaved surfaces and said segmented stripe at both ends thereof;
   a fourth semiconductor layer of the opposite conductivity type with respect to said first conductivity type formed in contact with said segmented stripe;
   an insulating layer covering said third semiconductor layer;
   a first electrode for supplying an electric potential through said fourth semiconductor layer; and
   a second electrode formed on said substrate for supplying a second electric potential thereto.

10. A semiconductor laser as claimed in claim 9, wherein the distances between said adjacent portions of said segmented stripe are constant.

* * * * *